US006696916B2

(12) United States Patent
Sanfilippo et al.

(10) Patent No.: US 6,696,916 B2
(45) Date of Patent: Feb. 24, 2004

(54) INTEGRATED VERTICAL RESISTOR STRUCTURE WITH REDUCED DIMENSIONS, FOR HIGH VOLTAGE, AND MANUFACTURING PROCESS THEREOF

(75) Inventors: Delfo Sanfilippo, Catania (IT); Davide Patti, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/746,373

(22) Filed: Dec. 22, 2000

(65) Prior Publication Data
US 2002/0057187 A1 May 16, 2002

(30) Foreign Application Priority Data
Dec. 24, 1999 (IT) .......................... TO99A1151

(51) Int. Cl.[7] .............................. H01C 1/012
(52) U.S. Cl. ................. 338/309; 257/536; 257/541; 257/543; 338/307
(58) Field of Search ................. 338/307, 308, 338/309; 257/536, 541, 543

(56) References Cited

U.S. PATENT DOCUMENTS

| 3,886,001 | A | * | 5/1975 | Dobkin ..................... 257/536 |
| 4,484,206 | A | * | 11/1984 | Moroshima et al. ........ 257/606 |
| 4,933,739 | A | * | 6/1990 | Harari ....................... 257/621 |
| 5,111,068 | A | * | 5/1992 | Kusakabe ................... 327/565 |
| 5,637,889 | A | * | 6/1997 | Groover et al. ............. 257/192 |
| 5,880,001 | A | * | 3/1999 | Camenzind ................. 438/330 |
| 5,880,513 | A | * | 3/1999 | Temple et al. .............. 257/539 |
| 5,945,699 | A | * | 8/1999 | Young ....................... 257/256 |

* cited by examiner

Primary Examiner—Karl D. Easthom
(74) Attorney, Agent, or Firm—Lisa K. Jorgenson; David V. Carlson; SEED IP Law Group PLLC

(57) ABSTRACT

The high-voltage resistor is of the vertical type, and is formed in a chip which includes a high-voltage region and a low-voltage region superimposed on the high-voltage region, both having a first conductivity type. An isolation region, at least partially buried, extends between the high-voltage region and the low-voltage region, and delimits a vertical resistive region connecting the high-voltage region to the low-voltage region.

21 Claims, 3 Drawing Sheets

INTEGRATED VERTICAL RESISTOR STRUCTURE WITH REDUCED DIMENSIONS, FOR HIGH VOLTAGE, AND MANUFACTURING PROCESS THEREOF

TECHNICAL FIELD

The present invention relates to an integrated vertical resistor structure with reduced dimensions, for high voltage, and to a manufacturing process thereof.

BACKGROUND OF THE INVENTION

As is known, high-voltage resistors are widely used in integrated power devices. For example, in devices which are formed using VIPower technology, a single semiconductor material chip houses power devices subject to high-value operative voltages (for example up to 2 KV), and control devices which normally operate with voltages lower than a few tens of volts.

In particular, in some applications, it is necessary to have voltages for biasing the control devices, which are obtained from the biasing voltage of the substrate. To provide a partition supplying the required voltage values, a resistor can be connected between the control devices, which operate at low voltage, and the substrate, which, like the power devices, can be biased to voltages of a few Kilovolts. The resistor must have a high resistance value, for example comprised between 100 KΩ and a few MΩ.

According to a known, commonly used solution, to form the high-voltage resistors, in a semiconductor material substrate a doped region with high resistivity is formed, which has conductivity opposite that of the substrate, and which also, in plan view, has the shape of a coil, with a plurality of branches which are parallel to one another, and adjacent in pairs.

However, this solution is disadvantageous owing to the required area. In fact, to prevent malfunctioning, adjacent branches of the coil resistor must be appropriately spaced, depending on the doping of the substrate and on the voltage applied to the ends of the resistor. This is due to the fact that, when an inverse voltage is applied to a junction region between conductive regions with opposite conductivity (as is the case between high-voltage resistors and the substrate), depletion areas are formed within the conductive regions and have an amplitude which depends on doping, as well as on the value of the applied inverse voltage. In particular, the dimensions of the depletion areas decrease as the concentration of doping agent increases, whereas it increases when the inverse voltage applied is increased.

Since, to be able to withstand high voltages, the substrate must be highly resistive, and therefore is formed by semiconductor material with a low concentration of doping agent, it is clear that the depletion areas in the substrate are very extensive. In particular, near the terminal of the resistor which is connected to the control devices, where the voltage drop between the resistor and the substrate is greater, it may happen that the depletion areas that are formed in the substrate at two adjacent branches of the coil resistor come into contact with one another, thus giving rise to pinch-off. This phenomenon causes significant deterioration of the resistance of the resistor, and therefore can adversely affect the correct operation of the entire circuit.

To prevent pinch-off from occurring, a minimum distance should be present between two adjacent branches of the resistor, the distance being no less than the sum of the amplitudes of the depletion areas associated with each of the two branches.

The large bulk of the coil resistor is also due to the fact that the high voltages which are applied to the resistor require edge structures for protection against premature breakdown in the regions of the resistor which are most subject to high voltages. For this purpose, metal field plates are formed, i.e., annular regions with a high resistivity, which surround the coil resistor.

A further factor which increases the bulk of a resistor of the above-described type, is its interaction with the edge structures of the devices to which it is connected, such that the resistor must be formed near the terminal region of the device supplying the high voltage.

To reduce the depletion area between the various branches of the coil resistor, a solution described in European patent application 98830638.7, filed on Oct. 23, 1998 by the same applicant, is based on forming the coil resistor from a highly resistive semiconductor material layer, which has conductivity opposite that of the substrate, and of forming one or more isolation trenches between each pair of adjacent parallel branches of the coil resistor. These isolation trenches, for example of silicon dioxide, extend in the substrate to a greater depth than the semiconductor material layer of the coil resistor, by an extent sufficient to prevent pinch-off.

However, according to this solution, the coil resistor is located close to the terminal region of the device supplying the high voltage, and consequently the obtainable reduction in bulk is relatively small, and the disadvantageous interaction between the resistor and the edge structures of the device integrating the resistor is still present.

SUMMARY OF THE INVENTION

According to the present invention, an integrated, semiconductor material device is provided, having a high-voltage resistor including a high-voltage region and a low-voltage region positioned above said high-voltage region, said high-voltage and low-voltage regions having a first conductivity type.

An isolation region, at least partially buried, and extending between said high-voltage region and said low-voltage region. The isolation region is interrupted at, and laterally delimiting, a vertical resistive region, which connects said high-voltage region to said low-voltage region.

According to the invention, a method for manufacturing an integrated device of semiconductor material comprising a high-voltage resistor is also provided, the method comprising the steps of:

forming a high-voltage region having a first conductivity type; and forming a low-voltage region having said first conductivity type, above said high-voltage region;

characterised by the step of forming an isolation region, at least partially buried, and arranged between said high-voltage region and said low-voltage region; said isolation region being interrupted at a vertical resistive region, which connects said high-voltage region to said low-voltage region.

BRIEF DESCRIPTION OF THE DRAWINGS

For a better understanding of the invention, some embodiments are now described purely by way of non-limiting example, with reference to the attached drawings, wherein.

DETAILED DESCRIPTION OF THE INVENTION

Figure 1:
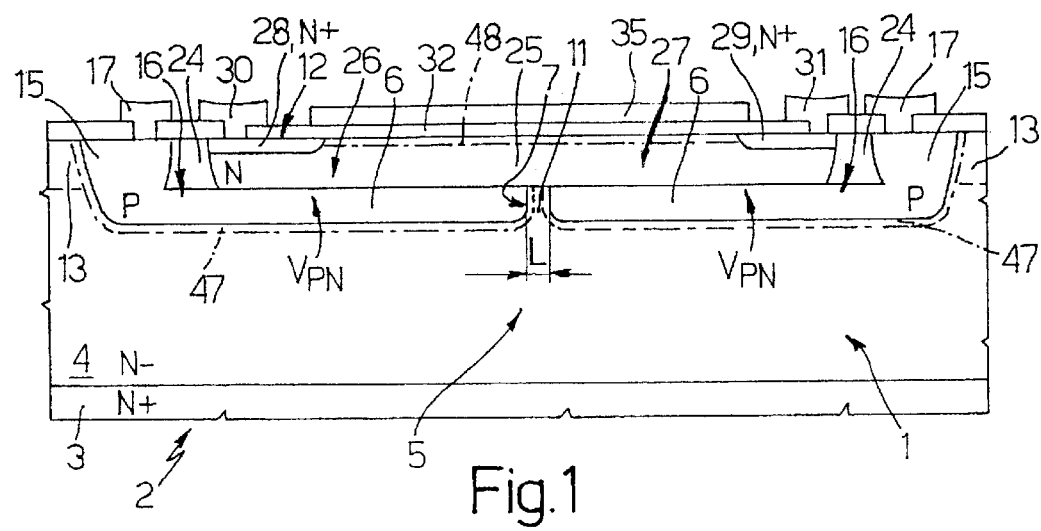
FIG. 1 shows a cross-section through a chip incorporating a first embodiment of the device according to the present invention.
Figure 2:
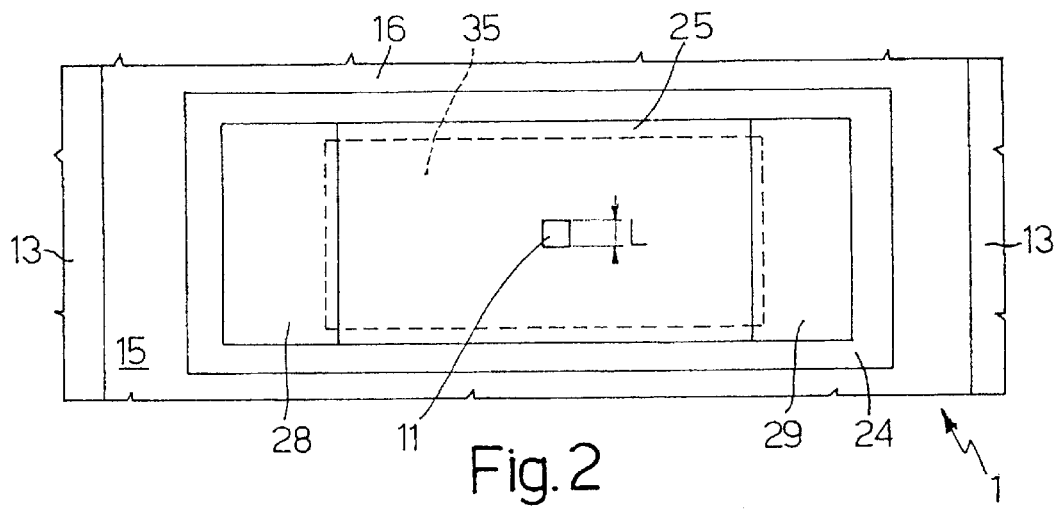
FIG. 2 is a plan view of the device of FIG. 1, some parts of which are not shown, for the sake of clarity.

As shown in FIGS. 1 and 2, an integrated device 2 of semiconductor material, for example silicon, comprising a resistor 1, is formed in a chip comprising a substrate 3, a first epitaxial layer 4 and a second epitaxial layer 13. The substrate 3 has N-type conductivity, and a first doping level, for example $10^{19}$ atoms/cm$^3$. The substrate 3 in one embodiment is a region of the bulk substrate for the entire chip. Substrate 3 is thus a substrate region, such as a well or some other defined region, of a high doping level and other regions in the same substrate may be of a different doping level (likely lower) or even of a different conductivity type. The first epitaxial layer 4, which is positioned on top of the substrate 3, has N-type conductivity, and a second doping level, lower than the first doping level, for example $10^{14}$ atoms/cm$^3$. The second epitaxial layer 13, positioned on top of the first epitaxial layer 4, has N-type conductivity and a doping level approximately equivalent to the doping level of the first epitaxial layer 4.

The integrated device 2 comprises a high-voltage region 5, located inside the first epitaxial layer 4, that is connected to a terminal of a power device, not shown.

In addition, the integrated device 2 comprises a buried region 6, with a substantially rectangular shape, having P-type conductivity. The buried region 6 extends to a predetermined distance from the surface 12 of the integrated device 2 (which is equivalent to the thickness of the second epitaxial layer 13), and has a central aperture 7, delimiting a portion of the substrate 3 which forms a vertical resistive region 11. The vertical resistive region 11 has a prevalent dimension which is substantially perpendicular with respect to the surface 12, and, in addition, in plan view it has substantially the shape of a square with sides having length L (FIG. 2). For example, the vertical resistive region 11 extends for 5–15 µm in a direction perpendicular to the surface 12, and the side length L is approximately 1–5 µm. In practice, the vertical resistive region 11 has a structure with a vertical current flow. In an alternative embodiment, the vertical resistive region "is circular in shape and forms a vertical cylinder while in yet a further alternative, the vertical resistive region" is rectangular in shape.

A deep region 15, of P-type conductivity and shaped as a rectangular frame, is provided in the second epitaxial layer 13, and extends in depth from the surface 12, as far as the outer edge of the buried region 6; the deep region 15 and the buried region 6 form an isolation region 16. In addition, an isolation contact 17, of metal, extends above the surface 12 and is connected to the deep region 15, such as to form a biasing terminal for the isolation region 16.

The isolation region 16 delimits an isolated well 24, formed by the second epitaxial layer 13. The isolated well 24 accommodates a low-voltage region 25 having a rectangular shape (FIG. 2) and N-type conductivity, which extends in depth as far as the buried region 6 and has a third doping, intermediate between the first and second doping levels, and, for example, of approximately $10^{15}$–$10^{17}$ atoms/cm$^3$. The low-voltage region 25 comprises a first resistive portion 26 and a second resistive portion 27, which extend from the vertical resistive region 11 in two opposite directions, parallel to the long side of the rectangular shape of the buried region 6.

At the ends remote from one another of the first resistive portion 26 and of the second resistive portion 27 of the low-voltage region 25, a first and a second surface contact region 28, 29 are formed, of N-type conductivity, and a fourth doping level, higher than the low-voltage region 25; the surface contact regions 28, 29 are connected directly to respective resistor contacts 30, 31 of metal, which define two low-voltage terminals of the resistor 1.

In addition, the integrated device 2 comprises an isolating layer 32 of dielectric material (for example silicon oxide), which has a predetermined thickness and covers entirely the surface 12, except for at the isolation contacts 17 and resistor contacts 30, 31.

Finally, a modulation region 35, preferably of polycrystalline silicon, extends on the isolating layer 32, substantially above the low-voltage region 25, between the first and second surface contact regions 28, 29 (in FIG. 2, the modulation region 35 is shown as a broken line).

Figure 3:
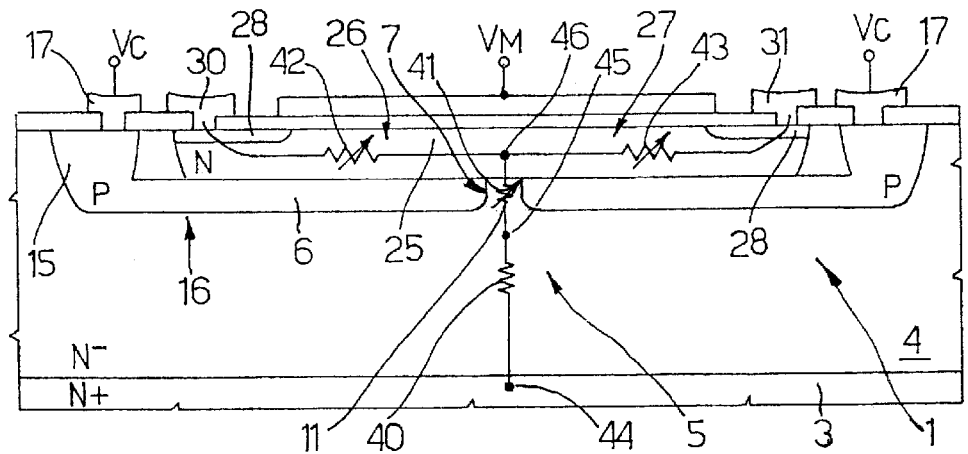
FIG. 3 shows the same cross-section of FIG. 1, to which the equivalent circuit diagram of the resistor has been indicated.

As shown in FIG. 3, the high-voltage region 5 forms a high-voltage resistive element 40. The high-voltage resistive element 40 has a first terminal connected to a high-voltage terminal 44 of the resistor 1 (which in turn is connected to a power device, not shown here), and a second terminal connected to a first node 45.

The vertical resistive region 11 forms an adjustable resistive element 41, having a first terminal connected to the first node 45, and a second terminal connected to a second node 46.

The first and second resistive portions 26, 27 form respectively a first and a second horizontal resistive element 42, 43, which have a first terminal connected to the second node 46, and a second terminal connected respectively to the resistor contacts 30 and 31. In practice, the high-voltage resistive element 40, the adjustable resistive element 41, and the first and second horizontal resistive elements 42, 43 form the resistor 1.

Since the first epitaxial layer 4 is only lightly doped, the high-voltage resistive element 40 has a high resistance.

The adjustable resistive element 41 has a resistance depending on a control voltage $V_C$ applied to the isolation contact 17 (FIGS. 1 and 3). In fact, since the first epitaxial layer 4 and the buried region 6 form an inversely biased PN junction inside the first epitaxial layer 4, and in particular inside the vertical resistive region 11, an isolation depletion region 47 is formed (FIG. 1) and has a dimension depending on the junction voltage drop $V_{PN}$ at the PN junction, and thus on the control voltage $V_C$. The isolation depletion region 47 reduces the useful area of the vertical resistive region 11, compared with the physical area $L^2$ due to the side length L, determining the resistance of the vertical resistive region 11. Consequently, the resistance of the vertical resistive region 11 depends, via the junction voltage drop $V_{PN}$, on the control voltage $V_C$.

Both the resistive elements 42, 43 have resistance varying as a function of a modulation voltage $V_M$ applied to the modulation region 35 (FIGS. 1, 2). In fact, inside the low-voltage region 25, by MOS effect, a modulation depletion region 48 (FIG. 1) is present and modifies the effective depth (and therefore the effective area) both of the first and second resistive portions 26, 27. In particular, the amplitude of the modulation depletion region 48 can be controlled, in a per se known manner, by varying the modulation voltage $V_M$; consequently, the resistances of the first and second resistive portions 26, 27 can also be modified. However, these resistances are much lower than the resistance of the high-voltage resistive element 40 and of the adjustable resistive element 41, owing to the different doping levels.

Since the high-voltage region 5 and the vertical resistive region 11 have high resistance, the voltage drop at the resistor 1 is located mainly at these regions, and a reduced voltage drop is present at the low-voltage region 25 (of a few tens of volts at the most); in addition, since the vertical resistive region 11 has a very small area and high resistance, the low-voltage region 25 and thus the isolated well 24 are substantially isolated from the high-voltage region 5. The high voltage applied to the ends of the resistor 1 therefore does not affects any low-voltage components (not shown), which are formed in the second epitaxial layer 13.

The resistor 1 is formed as follows. On the substrate 3 of semiconductor material, the first epitaxial layer 4 is grown. Subsequently, through a photolithographic process, a doping agent designed to form the buried region 6 is implanted. The implanted doping agent is then activated through a thermal process, and the second epitaxial layer 13 is then grown; thereby, the buried region 6 is positioned at a predetermined depth from the surface 12 of the second epitaxial layer 13. As an alternative, a single epitaxial layer with the required thickness is grown, and the buried region 6 is implanted at high energy, such as to be located at the required depth.

Subsequently, the deep region 15 is formed, to complete the isolation region 16 and delimit the isolated well 24; then, through an implantation and diffusion process, the low-voltage region 25 is formed inside the isolated well 24.

Subsequently, through a photolithographic process and ionic implantation, the surface contact regions 28, 29 are formed; then, in a per se known manner, the isolating layer 32 and the modulation region 35 are formed.

Finally, the contacts are opened and metal regions are formed, to form the isolation contact 17 and the resistor contacts 30, 31.

The resistor 1 described has the following advantages.

Firstly, it has a relatively small size. Thanks to the use of the epitaxial layer 4, which has a very high resistivity, and because the vertical resistive region 11 has a length L of a few microns, it is not necessary to form resistive sections with a long length. For example, the resistor 1 of FIG. 1 occupies an area of 3,000–4,000 $\mu m^2$ in plan view. The overall dimension are also reduced because, in the resistor according to the present invention, the voltage drop is held almost totally by the first epitaxial layer 4, which has a low doping level and a high voltage level. Consequently, it is not strictly necessary to form protective structures to avoid breakdown, such as field plates or highly resistive rings. In addition, the resistor 1 can be integrated inside low-voltage areas, since it does not have any interactions with edge structures of the devices to which it is connected: consequently, it is possible to obtain a more compact layout of the entire circuit.

In addition, the overall resistance of the resistor 1 can advantageously be adjusted through the modulation voltage $V_M$ and the control voltage $V_C$. In particular, the modulation voltage $V_M$ makes it possible to obtain a low-tolerance voltage divider.

The resistor 1 can have a conventional structure with two terminals, electrically connecting the resistor contacts 30, 31 through a metal line. As an alternative, it is possible to have several low-voltage terminals, which optionally supply different voltage. In fact, this can be obtained simply by forming the resistive portions 26, 27 of the low-voltage region 25 with different lengths.

Figure 4:
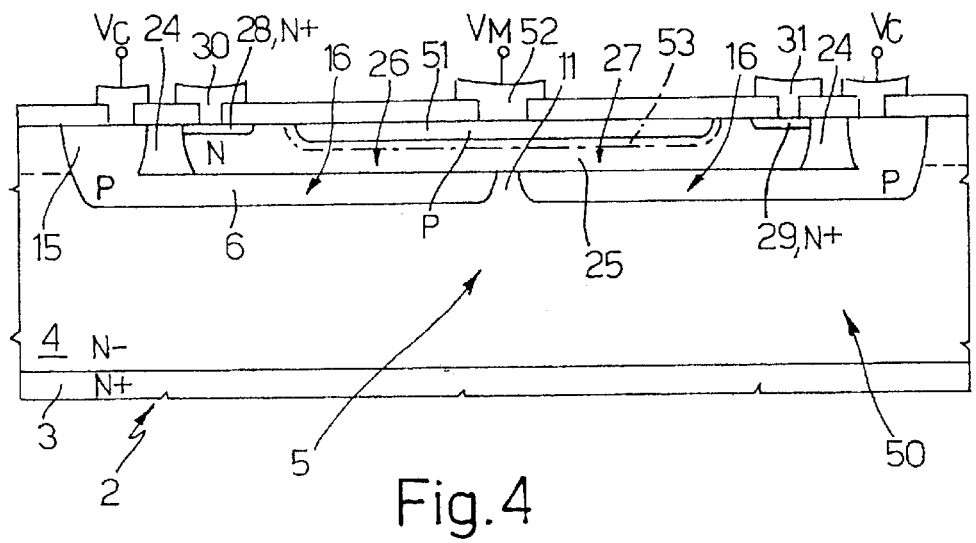
FIG. 4 shows a cross-section through a chip incorporating the device according to the invention, in a second embodiment.

FIG. 4, in which parts in common with the embodiment of FIG. 1 are indicated with the same reference numbers, illustrates a second embodiment of the present invention. According to this embodiment, the integrated device 2, comprising the high-voltage region 5, the vertical resistive region 11, the isolated well 24 separated from the high-voltage region 5 by the isolation region 16, and the low-voltage region 25, differs from the integrated device 2 of FIG. 1 in that a modulation region 51, of P-type, is formed in a surface portion of the low-voltage region 25. The modulation region 51 is also connected to a metal contact region 52, which defines a modulation terminal, and receives the modulation voltage $V_M$.

The modulation region 51 has the same function as the modulation region 35 of FIG. 1. In this case, in particular, the low-voltage region 25 and the modulation region 51 form a PN junction, which is inversely biased through the modulation voltage $V_M$. Thus, inside the low-voltage region 25, a depletion region 53 is formed and reduces the depth (and therefore the area) of the resistive portions 26, 27 of the low-voltage region 25, consequently increasing the overall resistance. In addition, the variation of the modulation voltage $V_M$ causes firstly the inverse voltage applied to the PN junction, between the low-voltage region 25 and the modulation region 51 to vary, and secondly the amplitude of the modulation depletion area 53 and of the depth of the resistive portions 26, 27 to also vary. In this case also, it is therefore possible to modify the resistance of the first and second resistive portions 26, 27.

The high-voltage resistor 50 is formed according to the following method.

Initially, the same processing steps are carried out as described for forming the resistor 1 of FIG. 1. In particular, the first epitaxial growth is carried out, followed by the photolithographic process, the ionic implantation, and the thermal process for activating the implanted doping agent, which is designed to form the buried region 6. The second epitaxial layer 13 is then grown, and the deep regions 15 and the low-voltage region 25 are formed.

Then, using two successive photolithographic processes, and two respective ionic implantations, the surface contact regions 28, 29 and the modulation region 51 are formed.

Finally, the contacts are opened and the metal regions are formed, to form the isolation contact 17, the resistor contacts 30, 31, and the metal contact region 52.

The above-described embodiment provides the same advantages as the resistor 1 of FIG. 1.

Figure 5:
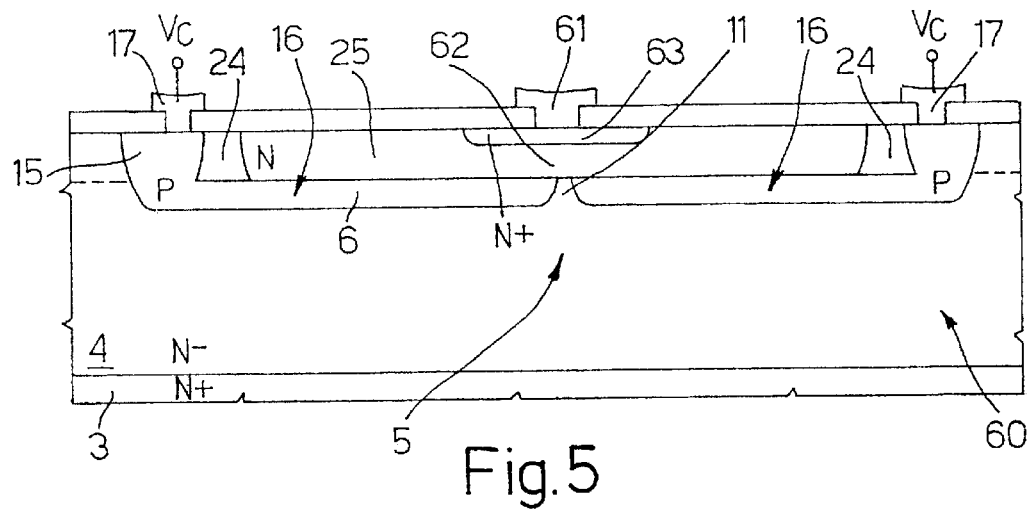
FIG. 5 shows a cross-section through a chip incorporating the device according to the invention, in a third embodiment.

FIG. 5, in which parts in common with FIG. 1 are indicated by the same reference numbers, and are not described again, illustrates a third embodiment of the present invention in which the high-voltage resistor is indicated at 60.

The integrated device 2 comprises a resistor contact 61 of metal, which is vertically aligned with the vertical resistive region 11, and is connected to a low-voltage resistive portion 62 of the low-voltage region 25, via a surface contact region 63, which has N-type conductivity and a higher doping level than the low-voltage region 25.

Figure 6:
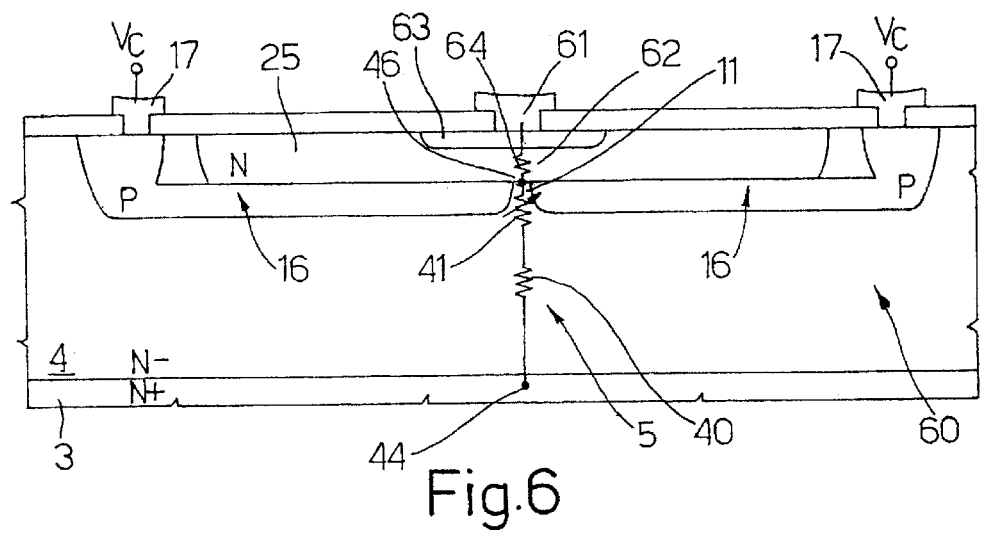
FIG. 6 shows the same cross-section of FIG. 5, to which the equivalent circuit diagram of the resistor has been indicated.

As shown in FIG. 6, which shows the structure of FIG. 5 with added electrical equivalents of the components of the resistor 60, the low-voltage resistive portion 63 forms a low-voltage resistive element 64, which has own terminals connected respectively to the node 46 and to the resistor contact 61, and has constant resistance.

To form the high-voltage resistor 60, the following method is used.

Initially, the same processing steps are carried out as used for forming the resistor 1 of FIG. 1, in particular as far as forming the low-voltage region 25.

Subsequently, through a photolithographic process and ionic implantation, the surface contact region 63 is formed, then the contacts are opened and the metal regions are formed, to form the isolation contact 17 and the resistor contact 61.

Unlike the resistor 1 of FIG. 1, the resistor 60 does not allow control of the resistance of the low-voltage portion 62, i.e., of the low-voltage resistive element 64, and, in addition, it is not possible to provide several low-voltage terminals which have different voltage values. However, the isolated well 24 can advantageously be formed with reduced dimensions, such as to considerably decrease the overall size of the resistor 60. In practice, for the same overall resistance, the bulk can be substantially reduced by half. In addition, formation of the resistor 60 is advantageously simplified, since the required processing steps are fewer and of a standard type, and are also used for forming other parts of the integrated circuit to which the resistor 60 belongs.

Figure 7:
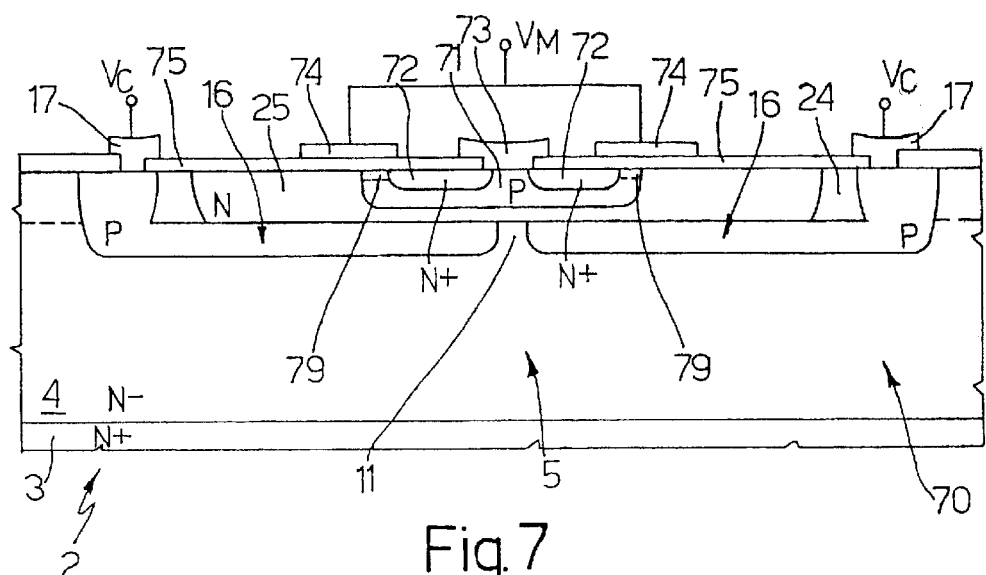
FIG. 7 shows a cross-section through a chip incorporating the device according to the invention, in a fourth embodiment.

A fourth embodiment of the device according to the present invention is shown in FIG. 7, in which the resistor is indicated at 70.

In FIG. 7, a conductive well 71, of P-type conductivity, is formed in the low-voltage region 25, above the vertical resistive region 11, and in turn surrounds an annular contact region 72. The annular contact region 72, of N-type, has a doping level higher than the low-voltage region 25 and is directly connected to a resistor contact 73, forming a low-voltage terminal of the resistor 70. In addition, an annular modulation region 74, of conductive material (for example polycrystalline silicon), extends on an isolating layer 75, for example silicon oxide, which covers all of the isolated well 24, except at the resistor contact 73. The annular modulation region 74 covers an outer portion of the annular contact region 72, part of the low-voltage region 25, and the portion of the conductive well 71 which is contained between the two latter, and is indicated as a channel portion 79.

Figure 8:
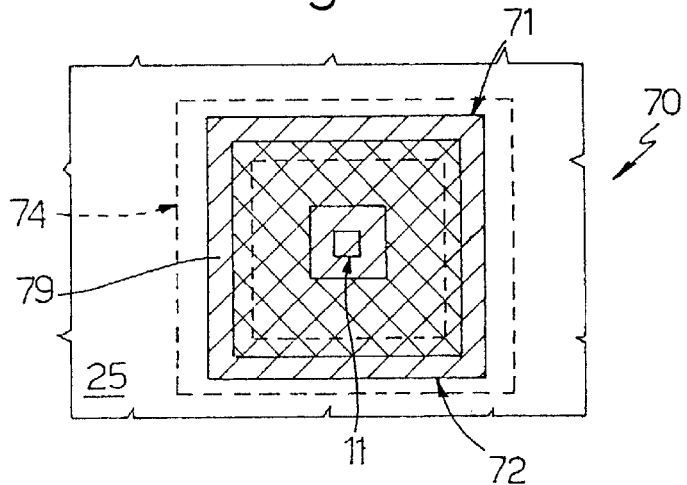
FIG. 8 is a plan view of the resistor of FIG. 7, some parts of which are not shown, for the sake of clarity.

FIG. 8 shows a plan view of the resistor 70, which, for the sake of clarity, does not show the isolating layer 75 and the resistor contact 73, and shows within broken lines the conductive well 71 and the annular modulation region 74.

As illustrated in FIG. 7, when the modulation voltage $V_M$ exceeds a predetermined threshold, a conductive channel is formed by MOS effect in the channel portion 79 of the conductive well 71 (arranged between the annular contact region 72 and the low-voltage region 25) and allows passage of current between the low-voltage region 25 and the annular contact region 72. This conductive channel has resistance depending on the voltage drop between the channel portion 79 of the conductive well 71 and the annular modulation region 74, and thus on the modulation voltage $V_M$.

Figure 9:
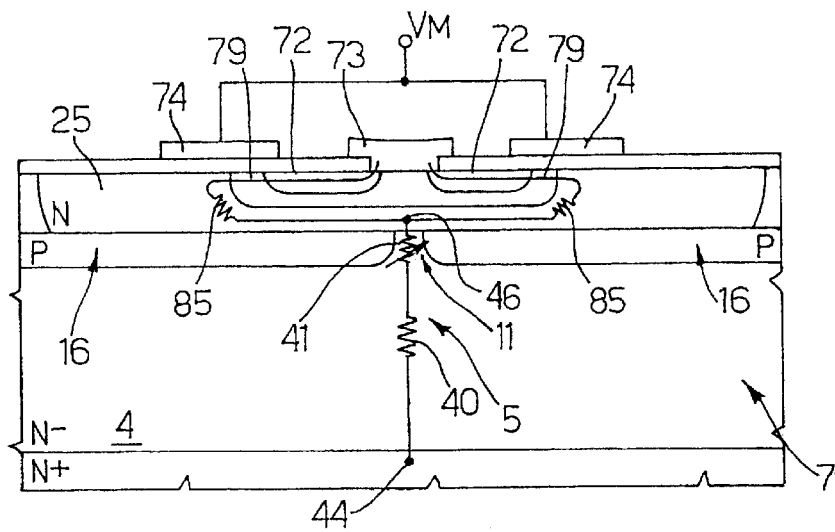
FIG. 9 shows the same cross-section of FIG. 7, to which the equivalent circuit diagram of the resistor has been indicated.

Consequently, the portion of the low-voltage region 25 extending below the conductive well 71, the channel portion 79 of the conductive well 71, and the annular contact region 72, form a modulable resistive element 85 (FIG. 9), having a first terminal connected to the node 46, a second terminal connected to the resistor contact 73, and a variable resistance, which can be modified through the modulation voltage $V_M$.

The high-voltage resistor 70 is formed as follows.

Initially, the same processing steps are carried out as for forming the resistor 1 of FIG. 1, in particular as far as forming the low-voltage region 25.

Then, through two successive photolithographic processes and corresponding ionic implantations, respectively the conductive well 71 and the annular contact region 72 are formed, and then the isolating layer 75 and the annular modulation region 74.

Finally, the contacts are opened and the metal regions are formed, to form the isolation contact 17 and the resistor contact 73.

The above-described fourth embodiment provides the advantage that it requires a very limited bulk, which is substantially similar to the bulk of the resistor 60 of FIG. 4. In addition, it is possible to control the overall resistance through the modulation voltage $V_M$.

Finally, it is apparent that further modifications and variations can be made to the described high-voltage resistor, without departing from the scope of the present invention.

In particular, the resistor can be formed using regions with opposite conductivity. In addition, the shape of the various regions can vary from that shown, for example in plan view the vertical resistive portion 11 can have a circular shape instead of square; similarly, the buried region 6 and the deep region 15 can have rounded edges or an oval shape.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A high-voltage resistor formed in semiconductor comprising:
    a substrate region;
    a high-resistive region, positioned above said substrate region;
    an isolation region, positioned above the high-resistive region;
    a medium-resistive region, positioned above the isolation region; and
    a vertical resistive region extending from the medium-resistive region to the high-resistive region which electrically connects the medium-resistive region to the high-resistive region; and
    an electrode coupled to the isolation region for providing a voltage on the isolation region that modifies the resistance of the vertical resistive region.

2. The device according to claim 1, wherein said vertical resistive region is positioned in an aperture that extends through the isolation region.

3. The device according to claim 1, wherein said medium-resistive region is positioned within, and surrounded by, the isolation region.

4. A high-voltage resistor formed in an integrated device of semiconductor material, comprising:

a high-voltage region;

a low-voltage region positioned over said high-voltage region, said high-voltage and low-voltage regions having a first conductivity type;

an isolation region, at least partially buried, and positioned between said high-voltage region and said low-voltage region, said isolation region being interrupted at, and laterally delimiting a vertical resistive region which connects said high-voltage region to said low-voltage region; and a substrate region positioned below said high-voltage region, said substrate region, said high-voltage region and said low-voltage region being of monocrystalline semiconductor material, said substrate region having a first doping level, said high-voltage region having a second doping level, lower than said first doping level, and said low-voltage region having a third doping level, intermediate between said first and said third doping level.

5. A high-voltage resistor formed in an integrated device of semiconductor material, comprising:

a high-voltage region, a low-voltage region positioned over said high-voltage region, said high-voltage and low-voltage regions having a first conductivity type;

an isolation region, at least partially buried, and positioned between said high-voltage region and said low-voltage region, said isolation region being interrupted at, and laterally delimiting a vertical resistive region which connects said high-voltage region to said low-voltage region;

contact regions positioned peripherally on said low-voltage region; and substantially horizontal resistive regions formed in said low-voltage region.

6. A resistor device comprising:

a high voltage region having a first doping level;

a low-voltage region positioned over the high voltage region, and having the same conductivity type as the high voltage region, the low-voltage region having a second doping level different from the first doping level;

an isolation region positioned between the high voltage region and the low voltage region, the isolation region an aperture between the high voltage region and low voltage region such that the high voltage region is in electrical contact with the low-voltage region via a resistor within the aperture; and a modulation connection for varying the resistance of the resistor in the aperture.

7. The resistor device according to claim 6 wherein the first doping level is less than the second doping level.

8. The resistor device according to claim 6, further including a substrate positioned under the high voltage region and having a third doping level, wherein the first doping level is less than the third doping level and the third doping level is greater than the second doping level.

9. A resistor device comprising:

a substrate having a first doping level;

a high voltage region having a second doping level;

a low-voltage region being positioned over the high voltage region and having the same conductivity type as the high voltage region and having a third doping level; intermediate between to first and second doping levels, an isolation region between the high voltage region and low voltage region;

an aperture in the isolation region such that the high voltage region is in electrical contact with the low-voltage region.

10. A high-voltage resistor formed in an integrated device of semiconductor material, comprising:

a high-voltage region;

a low-voltage region positioned over said high-voltage region, said high-voltage and low-voltage regions having a first conductivity type;

an isolation region, at least partially buried, and positioned between said high-voltage region and said low-voltage region, said isolation region being interrupted at, and laterally delimiting a vertical resistive region which connects said high-voltage region to said low-voltage region; and a modulation region positioned between said high-voltage region and said low-voltage region for modulating the resistance of said low-voltage region such that said low-voltage region has a variable resistance.

11. The device according to claim 10, wherein said modulation region is a conductive region, ranged on said low-voltage region, and isolated from said low-voltage region through an isolation layer of dielectric material.

12. The device according to claim 11, wherein said modulation region is of polycrystalline semiconductor material.

13. The device according to claim 11, further including:

a conductive well, arranged in said low-voltage region; and an annular contact region positioned within the low-voltage region.

14. The device according to claim 13, wherein said conductive well has a second conductivity type, and said annular contact region has said first conductivity type.

15. The device according to claim 13, wherein said modulation region covers an outer portion of said annular contact region, an inner portion of said low-voltage region, and a channel portion of said conductive well.

16. The device according to claim 10, wherein said modulation region is a conductive region with a second conductivity type, surrounded by said low-voltage region and connected to a modulation terminal.

17. A resistance device comprising:

a first resistive region having a first resistance;

a second resistive region having a second lower resistance than the first region and position below the first resistive regions;

an isolation region between the first and second resistive regions and having an aperture; and a third resistive region positioned in the aperture of the isolation region and coupling the first resistive region to the second resistive region, the third resistive region comprising a modulation region that can alter the resistance of the second resistive region.

18. The resistance device of claim 17, wherein the isolation region is coupled to a contact region to receive an electrical signal.

19. The resistance device of claim 17, wherein the modulation region is formed separate from the second resistive region by a dielectric layer.

20. The resistance device of claim 17, wherein the modulation region is a conductive wail region structured in the second resistive region.

21. The resistance device of claim 17, wherein the modulation region is coupled to a contact region to receive a signal.

* * * * *

UNITED STATES PATENT AND TRADEMARK OFFICE
CERTIFICATE OF CORRECTION

PATENT NO. : 6,696,916 B2
DATED : February 24, 2004
INVENTOR(S) : Delfo Sanfilippo et al.

It is certified that error appears in the above-identified patent and that said Letters Patent is hereby corrected as shown below:

Column 9,
Line 22, "a high-voltage region," should read as -- a high-voltage region; --.
Line 64, "between to first" should read as -- between the first --.

Column 10,
Line 61, "conductive wail region" should read as -- conductive well region --.

Signed and Sealed this

Sixth Day of July, 2004

JON W. DUDAS
*Acting Director of the United States Patent and Trademark Office*